United States Patent
Joblot et al.

(10) Patent No.: US 8,841,748 B2
(45) Date of Patent: Sep. 23, 2014

(54) SEMICONDUCTOR DEVICE COMPRISING A CAPACITOR AND AN ELECTRICAL CONNECTION VIA AND FABRICATION METHOD

(75) Inventors: Sylvain Joblot, La Tronche (FR); Alexis Farcy, La Rovoire (FR); Jean-Francois Carpentier, Grenoble (FR); Pierre Bar, Grenoble (FR)

(73) Assignee: STMicroelectronics SA, Montrogue (FR)

( * ) Notice: Subject to any disclaimer, the term of this patent is extended or adjusted under 35 U.S.C. 154(b) by 349 days.

(21) Appl. No.: 13/298,735

(22) Filed: Nov. 17, 2011

(65) Prior Publication Data

US 2012/0133020 A1    May 31, 2012

(30) Foreign Application Priority Data

Nov. 30, 2010 (FR) ..................... 10 59917

(51) Int. Cl.
| | | |
|---|---|---|
| *H01L 21/02* | (2006.01) | |
| *H01L 23/58* | (2006.01) | |
| *H01L 21/768* | (2006.01) | |
| *H01L 23/48* | (2006.01) | |
| *H01L 23/522* | (2006.01) | |

(52) U.S. Cl.
CPC ... *H01L 23/5223* (2013.01); *H01L 2224/13024* (2013.01); *H01L 2224/14181* (2013.01); *H01L 2224/13022* (2013.01); *H01L 2224/16145* (2013.01); *H01L 2224/05548* (2013.01); *H01L 2224/02372* (2013.01); *H01L 21/76898* (2013.01); *H01L 23/481* (2013.01)
USPC ........... 257/532; 257/535; 257/621; 438/387; 438/396

(58) Field of Classification Search
CPC ............................. H01L 28/40; H01L 23/642
USPC ................... 257/532, 535, 621; 438/387, 396
See application file for complete search history.

(56) References Cited

U.S. PATENT DOCUMENTS

| | | |
|---|---|---|
| 2004/0108587 A1 | 6/2004 | Chudzik et al. |
| 2006/0001174 A1 | 1/2006 | Matsui |
| 2008/0113505 A1 | 5/2008 | Sparks et al. |
| 2008/0173993 A1 | 7/2008 | Andry et al. |
| 2009/0267183 A1 | 10/2009 | Temple et al. |

(Continued)

FOREIGN PATENT DOCUMENTS

JP        08-097367    *  4/1996  .............. H01L 27/04

OTHER PUBLICATIONS

Official English Translation of JP08097367 dated Apr. 1996, 11 pages.*

(Continued)

*Primary Examiner* — Evan Pert
(74) *Attorney, Agent, or Firm* — Gardere Wynne Sewell LLP

(57) ABSTRACT

A dielectric wafer has, on top of its front face, a front electrical connection including an electrical connection portion. A blind hole passes through from a rear face of the wafer to at least partially reveal a rear face of the electrical connection portion. A through capacitor is formed in the blind hole. The capacitor includes a first conductive layer covering the lateral wall and the electrical connection portion (forming an outer electrode), a dielectric intermediate layer covering the first conductive layer (forming a dielectric membrane), and a second conductive layer covering the dielectric intermediate layer (forming an inner electrode). A rear electrical connection is made to the inner electrode.

17 Claims, 13 Drawing Sheets

(56) References Cited

U.S. PATENT DOCUMENTS

2010/0032808 A1 2/2010 Ding et al.
2010/0041203 A1 2/2010 Collins et al.
2010/0230806 A1 9/2010 Huang et al.

OTHER PUBLICATIONS

French Search Report and Written Opinion for FR1059917 dated Jun. 27, 2011 (8 pages).

* cited by examiner

SEMICONDUCTOR DEVICE COMPRISING A CAPACITOR AND AN ELECTRICAL CONNECTION VIA AND FABRICATION METHOD

PRIORITY CLAIM

This application claims priority from French Application for Patent No. 1059917 filed Nov. 30, 2010, the disclosure of which is hereby incorporated by reference.

TECHNICAL FIELD

The present invention relates to the field of semiconductor devices.

BACKGROUND

It is known, in particular from United States Published Patent Application 2008/0173993, the disclosure of which is hereby incorporated by reference, to produce, via the front face of a substrate provided with integrated circuits, capacitors in a blind hole of the substrate, the electrodes of which have, above the front face of the substrate, front bosses extending radially to the blind hole and linked to the integrated circuits via a front electrical connection network. The proposed structure allows for only such an electrical connection for the capacitor.

There is a need to reduce the distances of the electrical connections and the electrical resistors, and/or a need to increase the integration densities and/or a need to increase the developed surface areas of the capacitors.

SUMMARY

There is proposed a semiconductor device.

The device may comprise a wafer provided, on top of a front face, with a front electrical connection means comprising an electrical connection portion parallel to this front face, a blind hole passing through the wafer and at least partially revealing a rear face of the electrical connection portion being provided.

The device may also comprise a through capacitor formed in the blind hole and comprising a conductive layer covering the lateral wall and the electrical connection portion and forming an outer electrode, a dielectric intermediate layer covering the above conductive layer and forming a dielectric membrane, and a filling conductive material, at least partially filling the dielectric intermediate layer and forming an inner electrode.

The device may also comprise a rear electrical connection means for the inner electrode.

The device may comprise an electrical connection means linked to said electrical connection portion.

The device may comprise an electrical connection via passing through said wafer.

The device may comprise an electrical connection means from the outer electrode of the capacitor to said electrical connection through via.

The wafer may comprise a semiconductor substrate on a front face of which are formed integrated circuits.

The device may comprise an electrical connection means linking said electrical connection portion and the integrated circuits.

The device may comprise an external electrical connection means for linking to an electronic device said electrical connection portion linked to the outer electrode of the capacitor.

The device may comprise an external electrical connection means for linking to an electronic device the inner electrode of the capacitor.

There is also proposed a method for fabricating a semiconductor device providing a wafer provided, on top of a front face, with a front electrical connection means comprising an electrical connection portion and comprising a capacitor.

The method may comprise: producing a blind hole through the wafer and as far as said electrical connection portion; forming, in succession, in the blind hole, a first conductive layer portion forming an outer electrode of the capacitor linked to said electrical connection portion, a dielectric layer forming a dielectric membrane of the capacitor and a second conductive layer portion forming an inner electrode of the capacitor; and producing a rear electrical connection means for the inner electrode.

The method may comprise: producing an electrical connection means between said electrical connection portion and integrated circuits of said wafer.

The method may comprise: producing a front external electrical connection means for said electrical connection portion.

The method may comprise: producing a rear external electrical connection means for the inner electrode.

There is also proposed a method for fabricating a semiconductor device comprising a wafer provided, on top of a front face, with a front electrical connection means comprising two electrical connection portions and comprising a capacitor and an electrical connection via.

The method may comprise: producing two blind holes through the wafer and as far as said electrical connection portions; depositing a first conductive layer and removing a part of this conductive layer so as to form a first conductive portion in the first blind hole and a second conductive portion in the second blind hole; depositing a dielectric layer and removing a part of this dielectric layer so as to form a dielectric membrane in the hole of the first conductive portion; and depositing a second conductive layer in the hole of the dielectric membrane and in the hole of the second conductive portion.

Thus, the first conductive portion, the dielectric membrane and the second conductive layer may form, in the first blind hole, an outer electrode, a dielectric membrane and an inner electrode of said capacitor and the second conductive portion and the second conductive layer may form, in the second blind hole, said electrical connection via.

The second conductive layer may be cropped so as to isolate the inner electrode of said capacitor and the electrical connection via.

The method may comprise: producing an electrical connection means between said electrical connection portions and integrated circuits of said wafer.

The method may comprise: producing a front external electrical connection means for at least one of said electrical connection portions.

The method may comprise: producing a rear external electrical connection means for the inner electrode.

The method may comprise: producing a rear electrical connection means between the inner electrode and the electrical connection via.

BRIEF DESCRIPTION OF THE DRAWINGS

Semiconductor devices and their fabrication method will now be described by way of nonlimiting examples, illustrated by the drawing in which.

DETAILED DESCRIPTION OF THE DRAWINGS

Figure 9:
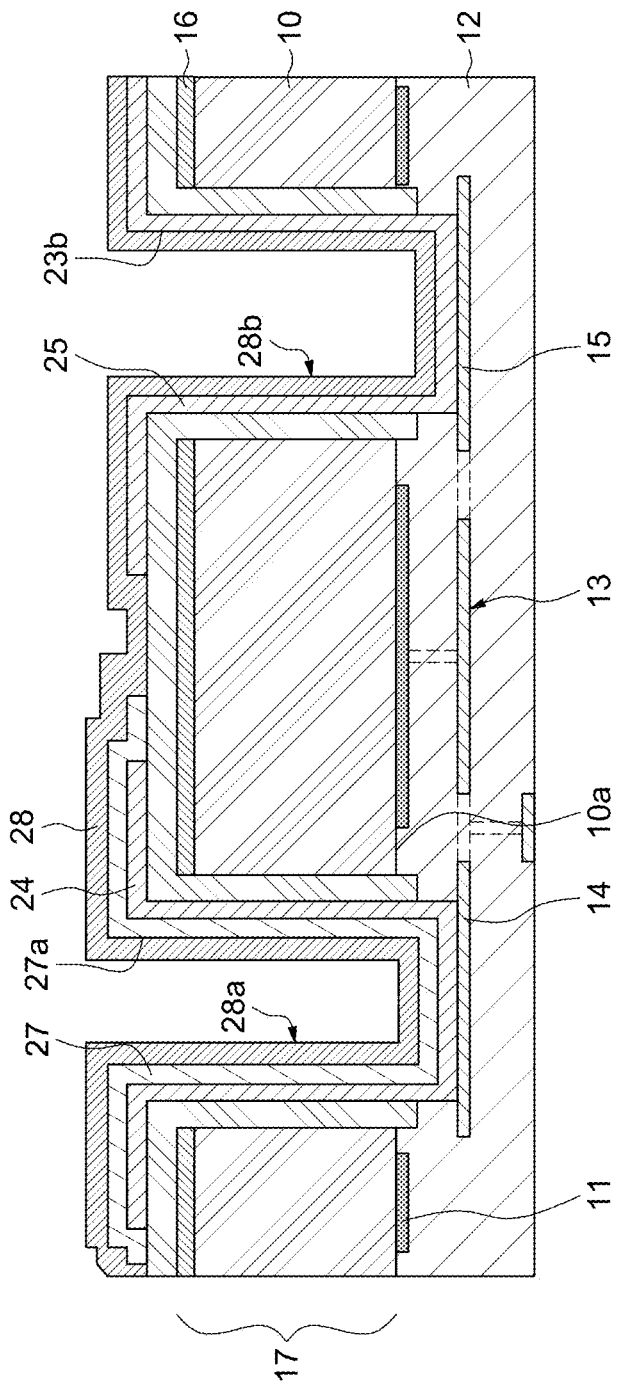
Figure 10:
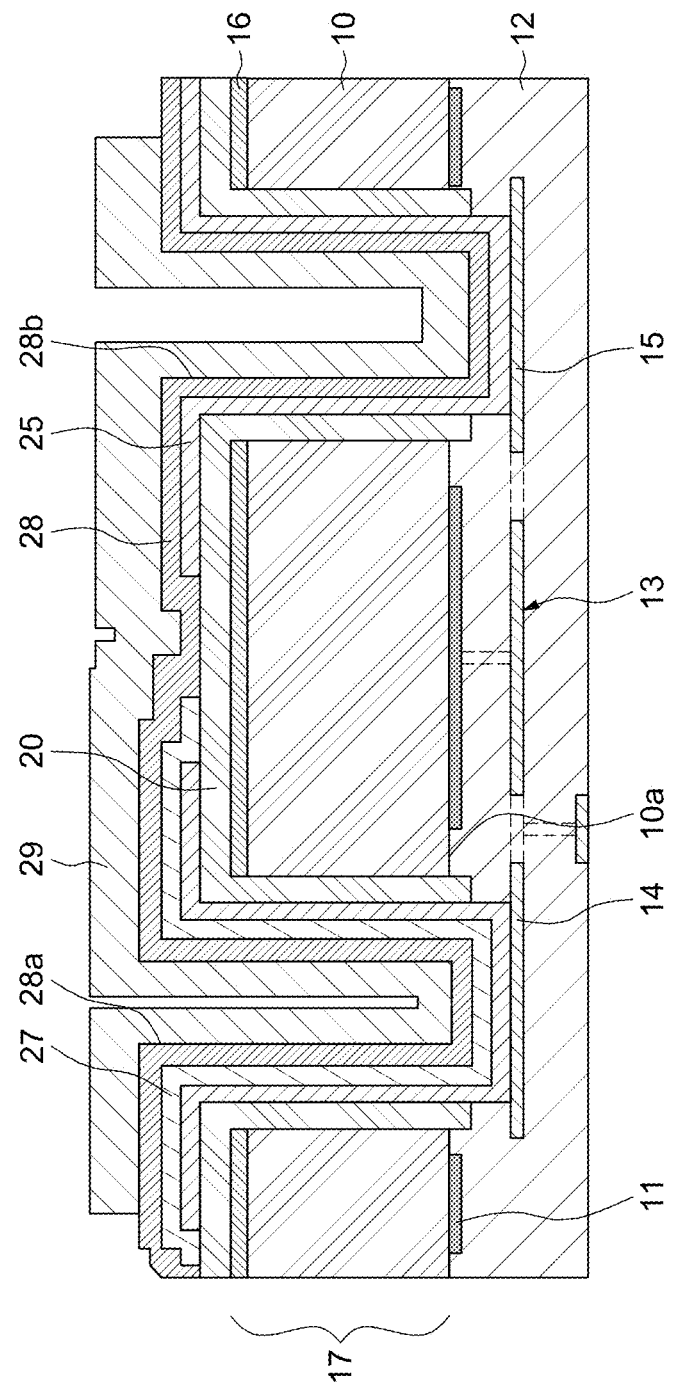
Figure 11:
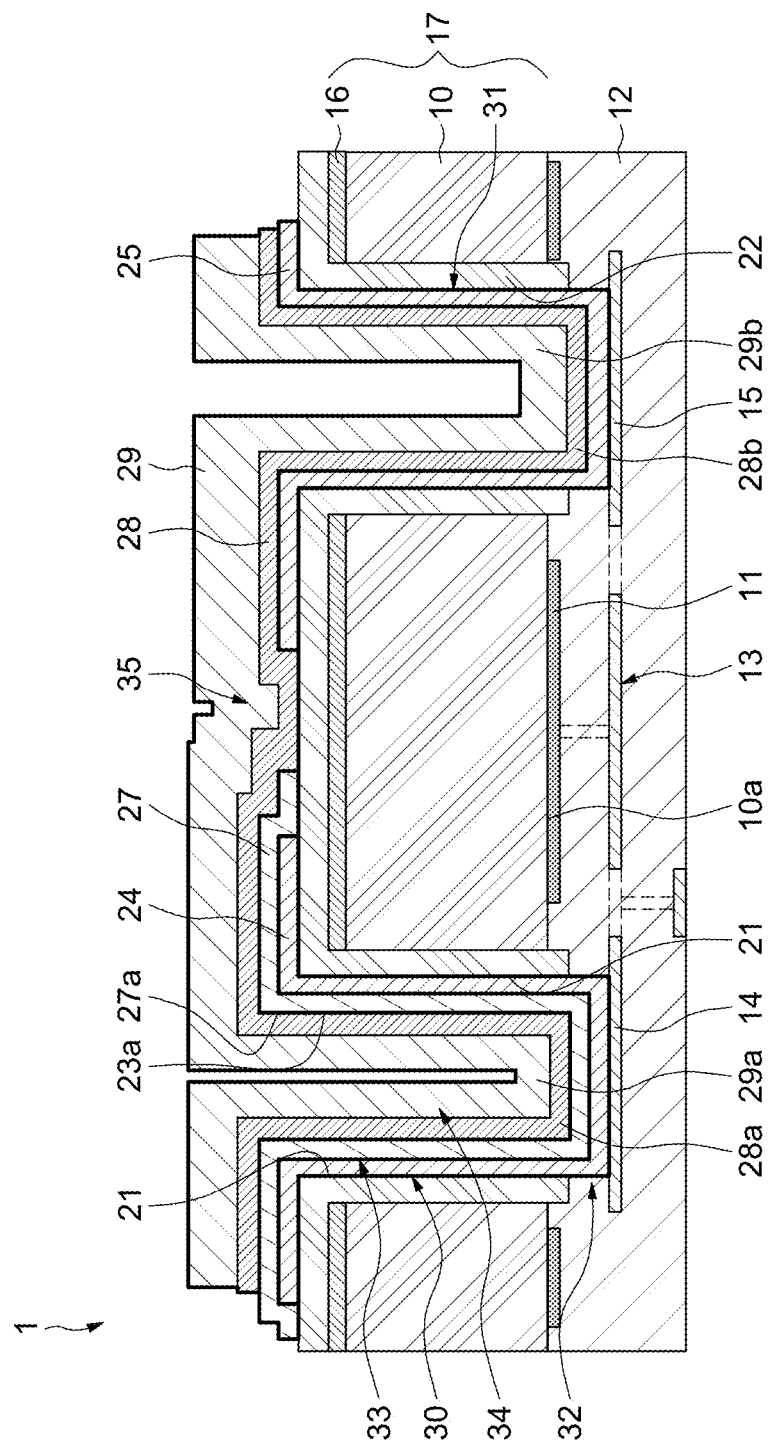
FIG. 11 represents, in cross section, a semiconductor device that is obtained.

Referring to FIGS. 1 to 10, there now follows a description of the successive steps making it possible to fabricate a semiconductor device 1 illustrated in FIG. 11.

Figure 1:
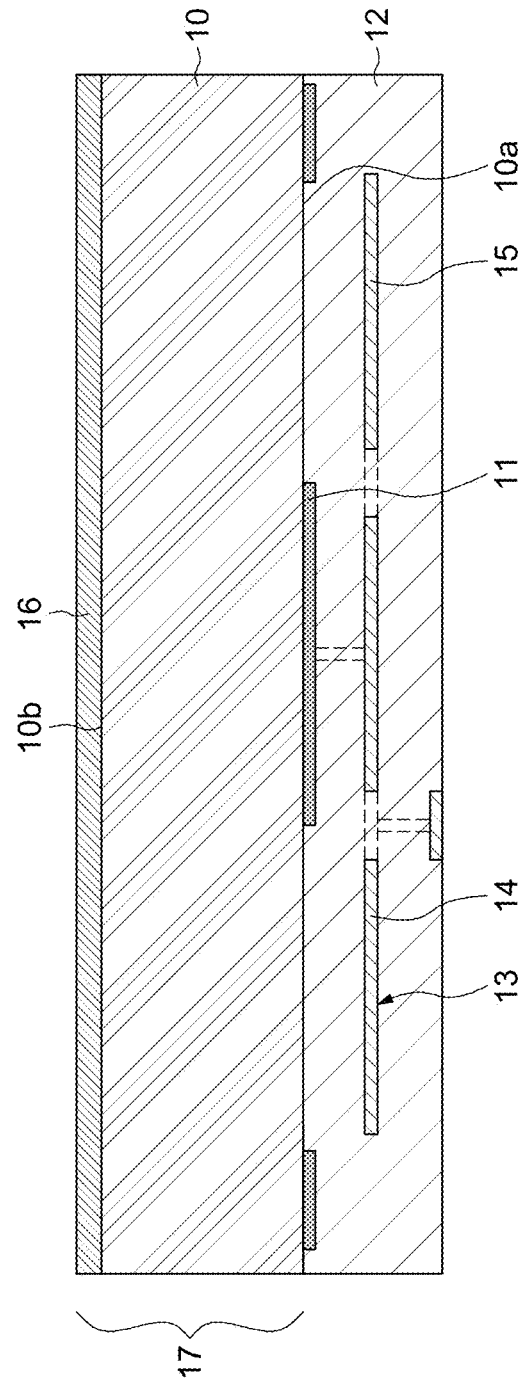
FIGS. 1 to 10 represent, in cross section, fabrication steps for a semiconductor device.

As illustrated in FIG. 1, there is a semiconductor substrate 10, for example made of silicon, on a front face 10a of which are produced integrated circuits 11 which do not occupy all of its surface. The substrate 10 is provided, on top of its front face 10a, in a front dielectric layer 12, possibly multiple layers, with a front electrical interconnect network 13 on one or more linked metallic levels. This front interconnect network 13 comprises two electrical connection portions 14 and 15 formed parallel to the front face 10a on regions that are not situated facing the integrated circuits (i.e., the portions 14 and 15 are positioned at locations corresponding to non-occupied substrate surfaces where integrated circuit 11 are not located).

There is deposited on the rear face 10b a rear layer 16 made of a dielectric material, for example silicon oxide ($SiO_2$), silicon carbonitride (SiCN), or silicon nitride (SiN), or amorphous carbon ($\alpha$-C), so as to form an etching and/or capacitive isolation layer, possibly sacrificial. There is then obtained a wafer 17 comprising the substrate 10, and possibly the front layer 12, provided with front electrical connection portions 14 and 15.

Figure 2:
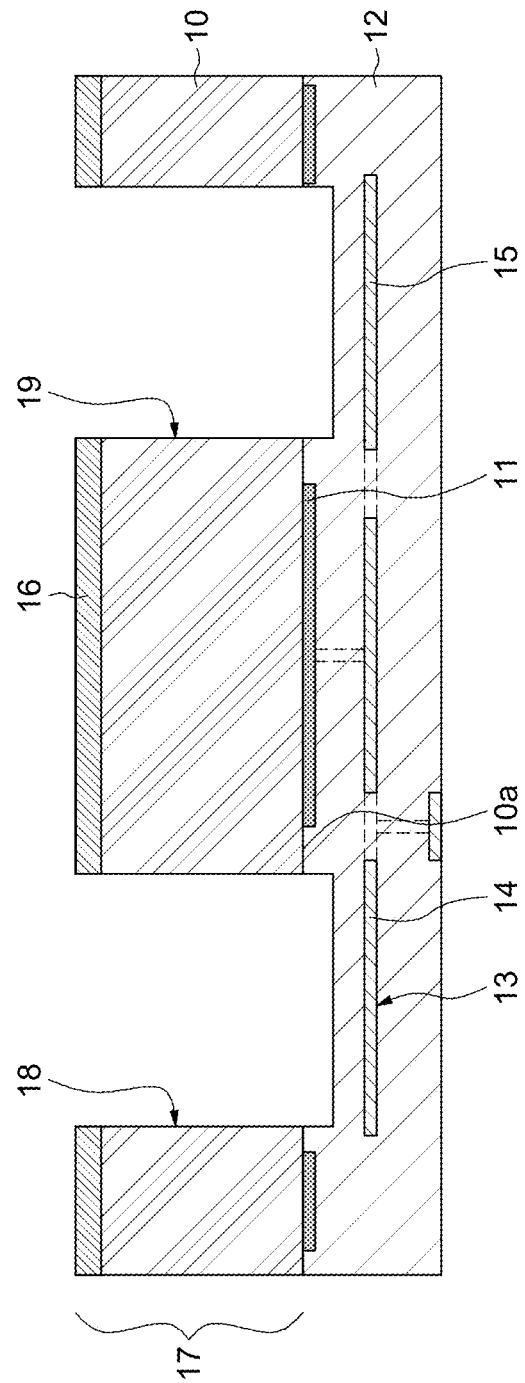

Then, as illustrated in FIG. 2, there are produced by etching from the rear, in areas free of integrated circuits 11 and facing electrical connection portions 14 and 15, spaced-apart blind holes 18 and 19, circular for example, through the rear dielectric layer 16, through the substrate 10 and into the front dielectric layer 12, without these blind holes 18 and 19 reaching the electrical connection portions 14 and 15.

Figure 3:
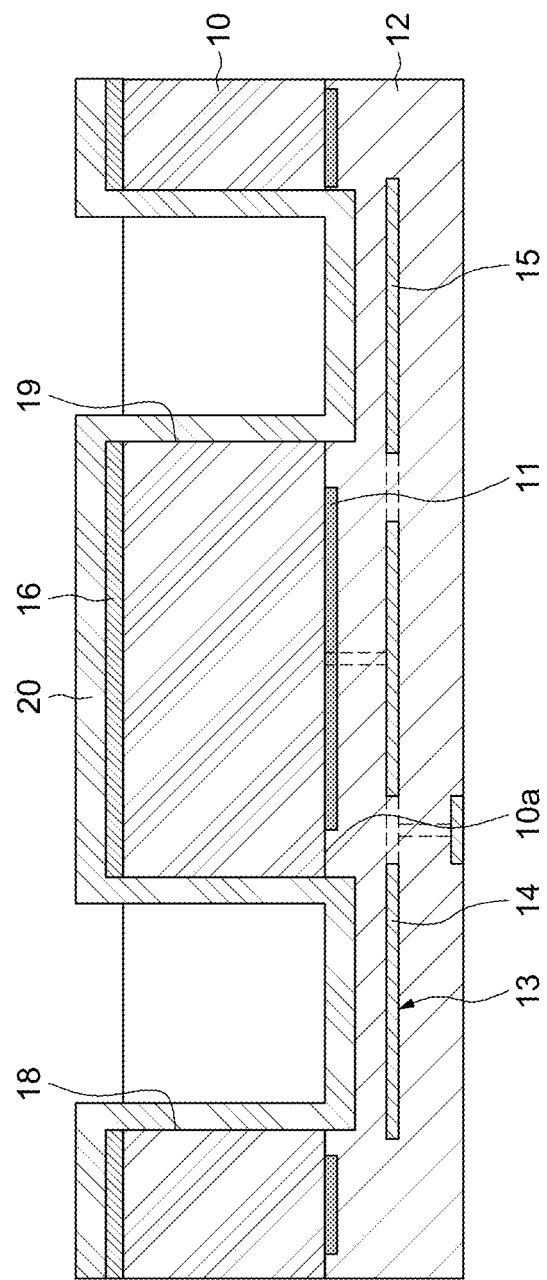

Then, as illustrated in FIG. 3, there is a deposition of a rear layer 20 made of a dielectric material, for example silicon oxide (SiO2), which, in a continuous manner, covers the rear face of the remaining rear layer 16, and the walls and the bottoms of the blind holes 18 and 19.

Figure 4:
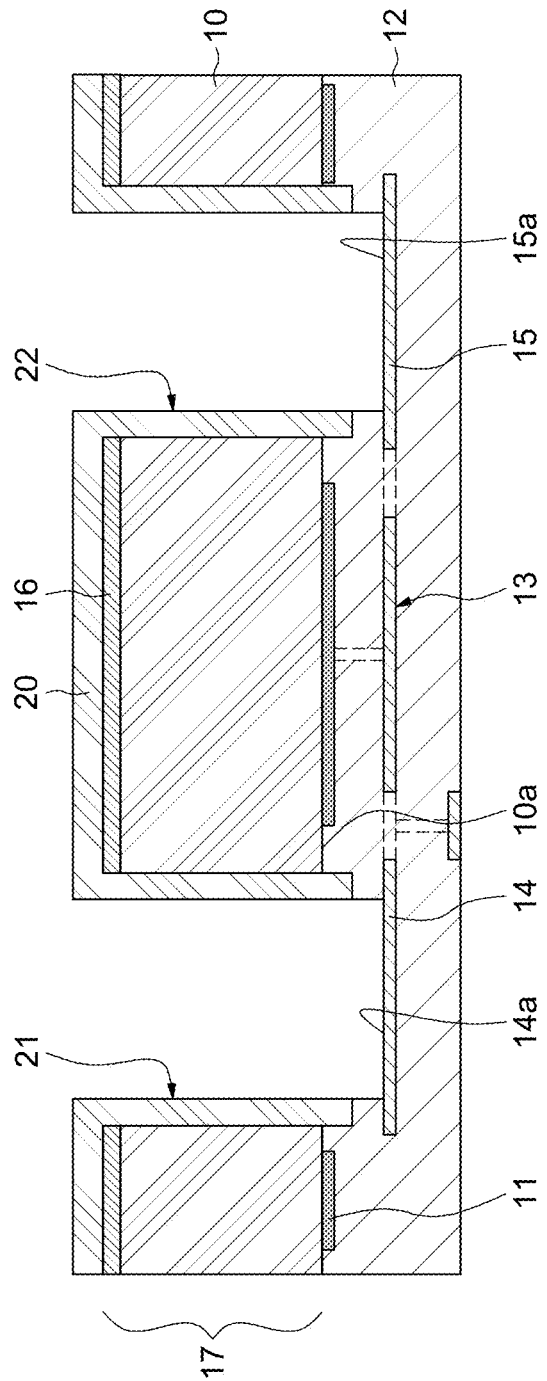

Then, as illustrated in FIG. 4, etching is used to obtain a removal of the portions of the dielectric layer 20 situated in the bottoms of the holes 18 and 19 and of the portions of the front dielectric layer 12 situated behind the electrical connection portions 14 and 15, so as to at least partially reveal the rear faces 14a and 15a of these electrical connection portions 14 and 15. There are then formed blind cylindrical holes 21 and 22 open at the rear and going as far as the rear faces 14a and 15a of the electrical connection portions 14 and 15. The rest of the dielectric layer 20 forms an insulating layer.

Figure 5:
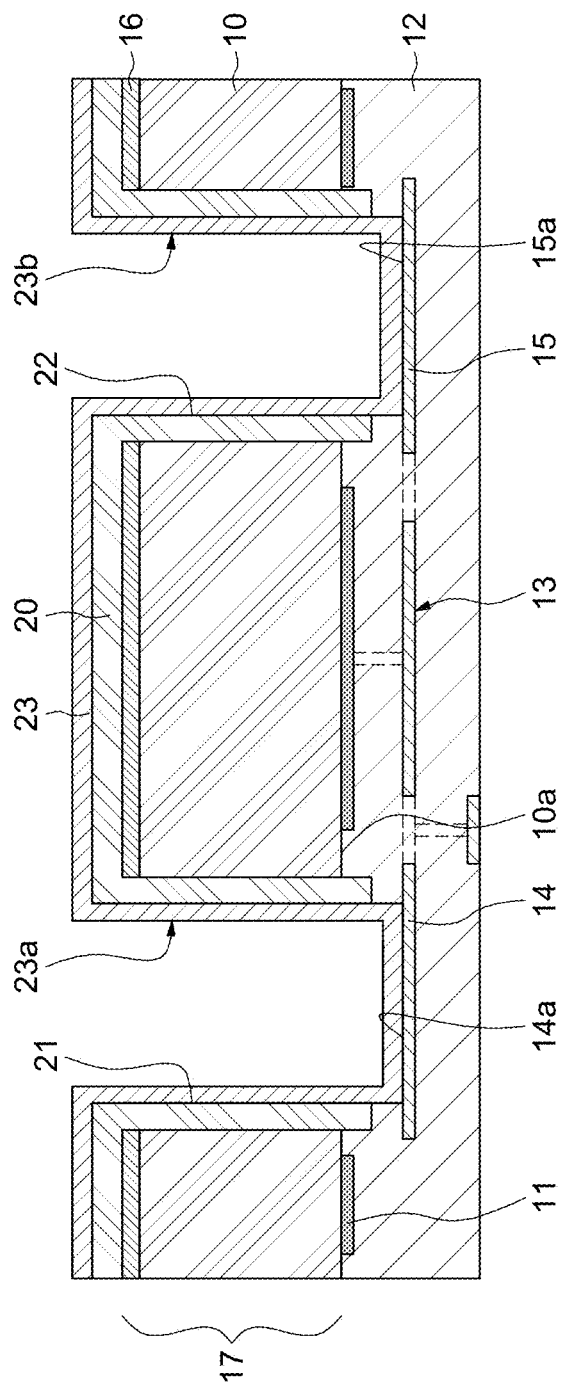

Then, as illustrated in FIG. 5, there is deposited a first rear layer 23 made of an electrically conductive material, for example titanium nitride (TiN), tantalum nitride (TaN) or similar, which, in a continuous manner, covers the rear face of the dielectric layer 20 and the lateral walls of the holes 21 and 22 and, in the bottoms of these holes 21 and 22, the rear faces 14a and 15a of the electrical connection portions 14 and 15, forming cylindrical blind holes 23a and 23b.

Figure 6:
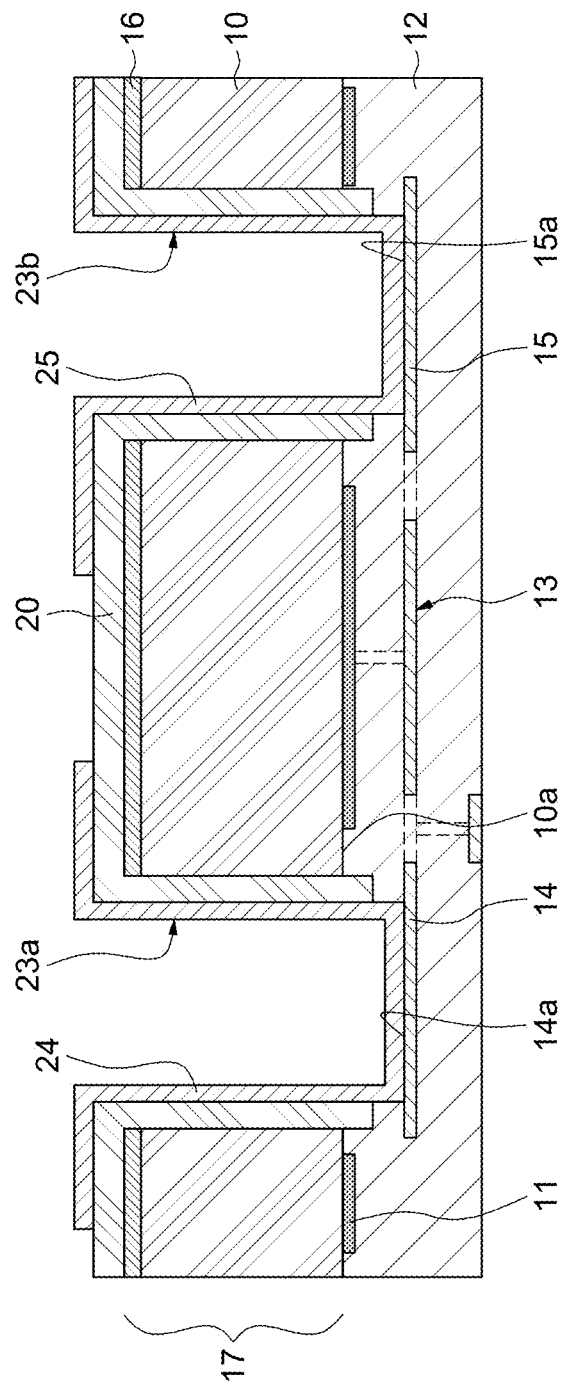

Then, as illustrated in FIG. 6, etching is used to obtain a partial removal of the conductive layer 23, on the rear face of the dielectric layer 20, so as to form separate or isolated conductive portions 24 and 25 which respectively cover the lateral faces and the bottoms of the holes 21 and 22 and, partially, the rear face of the dielectric layer 20.

Figure 7:
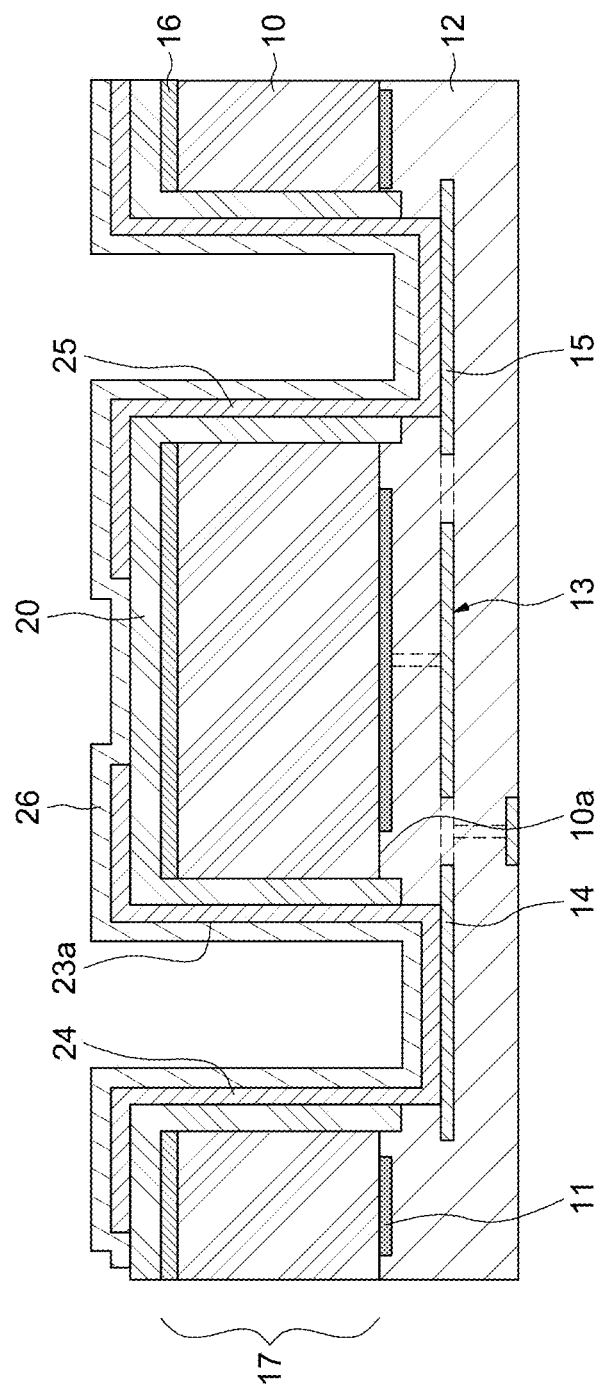

Then, as illustrated in FIG. 7, there is deposited a rear layer 26 made of a dielectric material, for example silicon oxide ($SiO_2$), tantalum oxide ($Ta_2O_5$), zirconium oxide ($ZrO_2$), or similar, which completely covers the portions 24 and 25 and the revealed parts of the dielectric layer 20.

Figure 8:
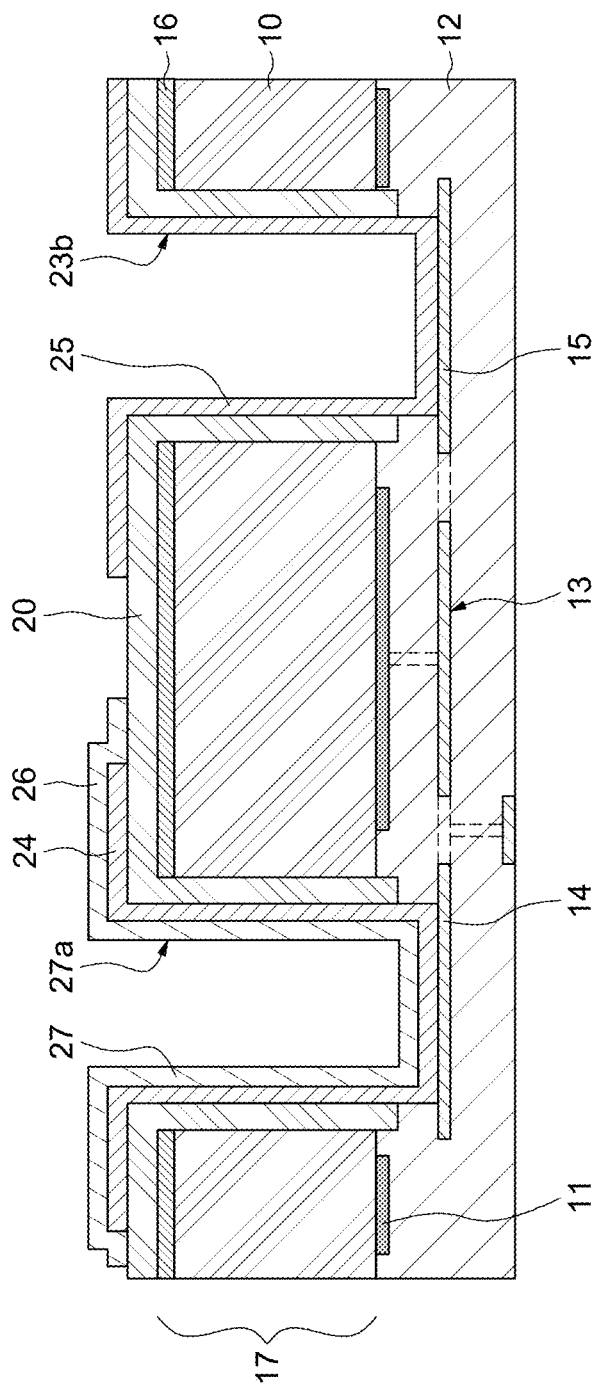

Then, as illustrated in FIG. 8, there is a partial removal of the dielectric layer 26 so as to leave remaining only a dielectric portion 27 covering the conductive portion 24 by forming a blind via 27a and not covering the conductive portion 25. Some portions of the dielectric rear layer 26 would overlie, for example, the peripheral wall of the hole 23b.

Then, as illustrated in FIG. 9, there is deposited a rear layer 28 made of an electrically conductive material, for example titanium nitride (TiN), tantalum nitride (TaN), or similar, which, in a continuous manner, covers the dielectric portion 27, notably in its blind hole 27a and by forming a blind hole 28a, the conductive portion 25, notably in its blind hole 23b and forming a blind hole 28b, and the rear surfaces between them. This conductive layer 28 forms a barrier to diffusion and/or entanglement.

Then, as illustrated in FIG. 10, there is deposited a thick layer 29 made of an electrically conductive material, for example copper (Cu), aluminum (Al), or similar, which covers at least partially the conductive layer 28 and at the same time fills, at least partially, the holes 28a and 28b formed by this conductive layer 28. The remainder of the layer 28, located at the outside of the layer 29, is then etched. The rear layer 28 and the thick layer 29 form a second conductive layer.

As can be seen in FIG. 11, the result of the above is that the semiconductor device 1 that is obtained comprises, on the one hand, a through capacitor 30 formed in the initial hole 21 passing through the wafer 17 and, on the other hand, a through electrical connection via 31 formed in the initial hole 22 also passing through the wafer 17, which are defined hereinbelow.

The through capacitor 30 comprises:
   an outer electrode 32 formed by the conductive portion 24, which comprises a cylindrical part in the hole 21, a radial part in contact on the electrical connection portion 14, at the bottom of this hole 21, so that this outer electrode 32 is linked to the front electrical interconnect network 13;
   a dielectric membrane 33 formed by the intermediate dielectric portion 27, which comprises a cylindrical part in the cylindrical part of the outer electrode 32 and a radial part on the radial part of the outer electrode 32, in the hole 23a;
   and an inner electrode 34 formed by the parts 28a and 29a of the layers 28 and 29 situated in the dielectric membrane 33, in the hole 27a.

According to the example described, the outer electrode 32, the dielectric membrane 33 and the inner electrode 34 also comprise, at the rear, superposed peripheral bosses.

The through electrical connection via 31 comprises, in the initial hole 22, the conductive portion 25 in contact on the electrical connection portion 15 and the parts 28b and 29b of the conductive layers 28 and 29 situated in the hole 23a of this conductive portion 25, so that this via 31 is linked to the front of the front electrical interconnect network 13.

According to the embodiment represented in FIG. 11, which devolves from the fabrication steps described previously, the conductive layers 28 and 29 form a rear electrical connection branch 35 such that the inner electrode 34 of the through capacitor 30 and the through electrical connection via 31 are linked in series via the rear, so that the inner electrode 34 is linked to the electrical interconnect network 13.

Figure 12:
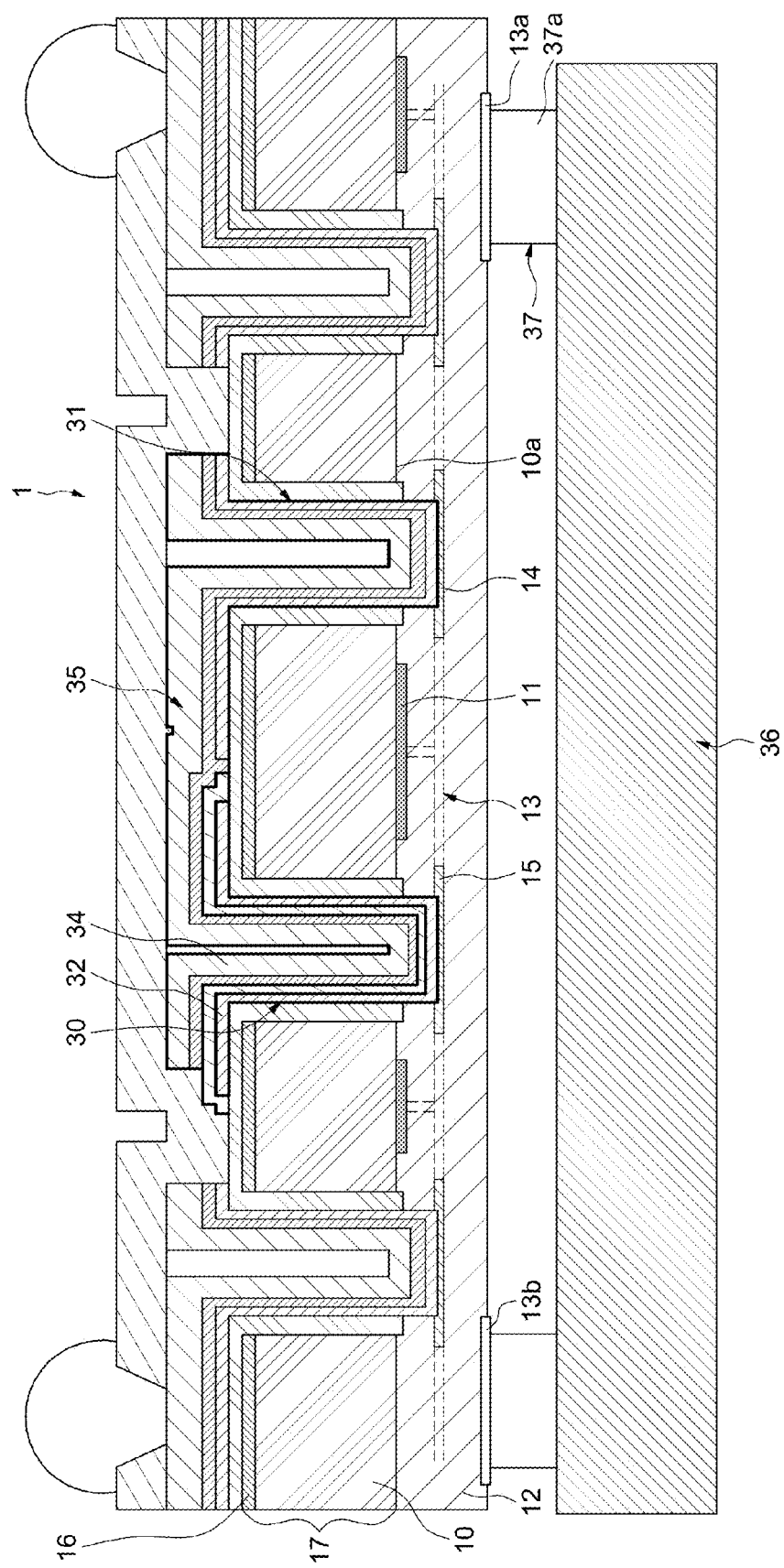
FIG. 12 represents, in cross section, a use of the device of FIG. 11.

Thus, as illustrated in FIG. 12, a number of variants are possible for the electrical link for the capacitor 30 as described below, depending on the different arrangements of the front electrical interconnect network 13 comprising the electrical connection portions 14 and 15.

According to a variant, the capacitor 30 may be linked to the integrated circuits 11. For this, the outer electrode 32 may be linked to the integrated circuits 11 by the front electrical interconnect network 13 and the inner electrode 34 may be linked to the integrated circuits 11 via the rear branch 35, the electrical connection via 31 and the electrical interconnect network 13.

According to another variant, the through capacitor 30 may be interposed between the integrated circuits 11 and an electronic device 36 positioned in front of the semiconductor device 1 and linked to the latter via a plurality of external electrical connection elements 37, for example balls. For this, the outer electrode 32 may be linked to the integrated circuits 11 via the front electrical interconnect network 13 and the inner electrode 34 may be linked to the electronic device 36 via the rear branch 35, the electrical connection via 31, the front electrical interconnect network 13 and a front electrical connection terminal 13a for this electrical interconnect network 13, on which is placed an electrical connection element 37a of the plurality of electrical connection elements 37. A reverse link could be envisaged.

According to yet another variant, the through capacitor 30 could be linked to the electronic device 36, without being linked to the integrated circuits 11. For this, the outer electrode 32 may be linked to a front electrical connection terminal 13b of the electrical interconnect network 13 on which is placed an electrical connection element of the plurality of electrical connection elements 37 and the inner electrode 34 may be linked, as described above, to the front electrical connection terminal 13a on which is placed the electrical connection element 37a.

Figure 13:
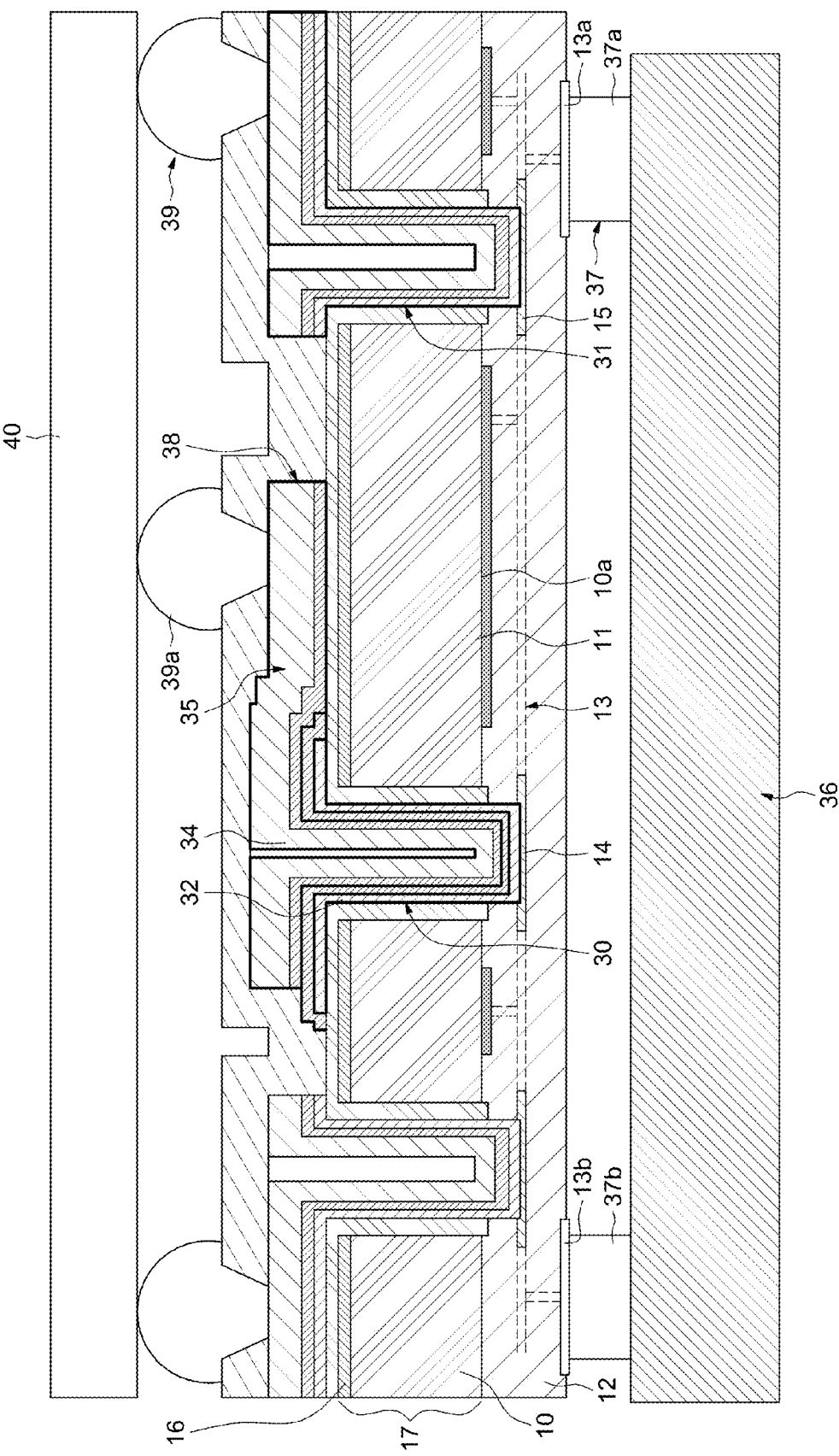
FIG. 13 represents, in cross section, another use of the device of FIG. 11.

According to another embodiment represented in FIG. 13, the inner electrode 34 of the through capacitor 30 and the through electrical connection via 31 are electrically insulated for example by prior etchings of the rear parts of the conductive layers 28 and 29, that is to say, by etching an insulation space 38 in the rear branch 35.

A number of variants for linking the capacitor 30 as described below are then possible depending on the different arrangements of the front electrical interconnect network 13 comprising the electrical connection portion 14, the electrical connection via 31 then being able to be used for other purposes.

The outer electrode 32 of the capacitor 30 may be linked to the integrated circuits 11 or to the electronic device 36 as described previously.

The inner electrode 34 of the through capacitor 30 may be linked to a rear external electrical connection element 39a on a remaining rear part of the layer 29, for example a ball, linked to another rear electronic device 40 mounted on the semiconductor device 1 via a plurality of rear external electrical connection elements 39.

Thus, the capacitor 30 may be electrically connected between, on the one hand, the integrated circuits 11 or the front electronic device 36 and, on the other hand, the rear electronic device 40.

Generally, the semiconductor device 1 may comprise a number of through capacitors 30 and a number of through electrical connection vias 31, which can be fabricated con-comitantly as described previously. The various interconnects, described previously, for the various through capacitors may be established, through capacitors may be connected in series or in parallel, through electrical connection vias may be used independently of the through capacitors.

The result of the above is that, in particular, it is possible to fabricate through capacitors, with electrodes that have large electrical connection surface areas and can easily be connected according to numerous configurations, while achieving low electrical connection resistances. It is also possible to achieve high integration densities.

As a variant embodiment, the layers 23, 26 and 28 could be deposited one after the other and then the layers 28, 26 and 23 could be etched successively before deposit of the layer 29 and addition of dielectric portions for isolation of the electrodes.

The present invention is not limited to the examples described above. In particular, some of the production steps described could be organized differently and the electrical connections could be presented according to differently combined arrangements. Many other variant embodiments are possible, without departing from the framework defined by the appended claims.

What is claimed is:

1. A semiconductor device, comprising:
   a semiconductor wafer having a front face;
   a dielectric layer on the front face of the semiconductor wafer, said dielectric layer including a front electrical connection comprising an electrical connection portion embedded within the dielectric layer at a position offset from and parallel to said front face;
   a blind hole formed in a rear face of the semiconductor wafer and having a depth passing completely through the semiconductor wafer and partially through the dielectric layer to reveal a rear face of the electrical connection portion;
   a capacitor formed in the blind hole, comprising:
      a first conductive layer covering a lateral wall of the blind hole and at least a portion of the rear face of the electrical connection portion and forming an outer electrode of the capacitor,
      a dielectric intermediate layer covering said first conductive layer and forming a dielectric membrane, and
      a second conductive layer covering the dielectric intermediate layer and forming an inner electrode of the capacitor, and
   a rear electrical connection for the inner electrode.

2. The device according to claim 1, comprising an electrical circuit formed on the front face of the semiconductor wafer and electrically linked to said electrical connection portion.

3. The device according to claim 1, comprising an electrical connection via passing through said wafer.

4. The device according to claim 3, comprising an electrical connection between the inner electrode of the capacitor and said electrical connection via.

5. The device according to claim 1, comprising an external electrical connection linking to an electronic device said electrical connection portion which is linked to the outer electrode of the capacitor.

6. The device according to claim 1, comprising an external electrical connection linking an electronic device to the inner electrode of the capacitor.

7. A method for fabricating a semiconductor device comprising:
   forming on a front face of a semiconductor wafer a dielectric layer including a front electrical connection comprising an electrical connection portion embedded within the dielectric layer at a position offset from and parallel to said front face;

producing a blind hole through a rear face of the semiconductor wafer and having a depth passing completely through the semiconductor wafer and partially through the dielectric layer to reveal a rear face of said electrical connection portion;

forming, in succession, in the blind hole, a first conductive layer portion forming an outer electrode of a capacitor linked to the rear face of said electrical connection portion, a dielectric layer forming a dielectric membrane of the capacitor and a second conductive layer portion forming an inner electrode of the capacitor; and producing a rear electrical connection for the inner electrode.

8. The method according to claim 7, comprising: producing an electrical connection between said electrical connection portion and an integrated circuit of said semiconductor wafer.

9. The method according to claim 7, comprising: producing a front external electrical connection to said electrical connection portion.

10. The method according to claim 7, comprising: producing a rear external electrical connection to the inner electrode.

11. A method for fabricating a semiconductor device comprising:

forming on a front face of a semiconductor wafer a dielectric layer including a front electrical connection comprising first and second electrical connection portions embedded within the dielectric layer at a position offset from and parallel to said front face;

producing a first blind hole and a second blind hole through a rear face of the semiconductor wafer and each having a depth passing completely through the semiconductor wafer and partially through the dielectric layer to reveal a rear face of said first and second electrical connection portions, respectively;

depositing a first conductive layer and removing a part of this conductive layer so as to form a first conductive portion in the first blind hole and a second conductive portion in the second blind hole;

depositing a dielectric layer and removing a part of this dielectric layer so as to form a dielectric membrane on the first conductive portion in the first blind hole; and depositing a second conductive layer on the dielectric membrane in the first blind hole and on the second conductive portion in the second blind hole;

wherein the first conductive portion, the dielectric membrane and the second conductive layer form, in the first blind hole, an outer electrode, a dielectric membrane and an inner electrode, respectively, of a capacitor; and wherein the second conductive portion and the second conductive layer form, in the second blind hole, an electrical connection via.

12. The method according to claim 11, further comprising cropping the second conductive layer so as to isolate the inner electrode of said capacitor from the electrical connection via.

13. The method according to claim 11, comprising: producing an electrical connection between said first and second electrical connection portions and one or more integrated circuits of said semiconductor wafer.

14. The method according to claim 11, comprising: producing a front external electrical connection to at least one of said electrical connection portions.

15. The method according to claim 11, comprising: producing a rear external electrical connection to the inner electrode.

16. The method according to claim 11, comprising: producing a rear external electrical connection between the inner electrode and the electrical connection via.

17. The device according to claim 1, further comprising an insulating layer in the blind hole between the first conductive layer and the semiconductor wafer.

* * * * *